United States Patent [19]
Boomer

[11] Patent Number: 5,142,251
[45] Date of Patent: Aug. 25, 1992

[54] WIDE BAND SELECTABLE GAIN AND OPERATING FREQUENCY CMOS OSCILLATOR CIRCUIT

[75] Inventor: James B. Boomer, Falmouth, Me.

[73] Assignee: National Semiconductor Corporation, Santa Clara, Calif.

[21] Appl. No.: 771,394

[22] Filed: Oct. 3, 1991

[51] Int. Cl.$^5$ ............................................. H03B 5/36
[52] U.S. Cl. ............................. 331/116 FE; 331/161; 331/179
[58] Field of Search .............. 331/116 R, 116 FE, 161, 331/179

[56] References Cited

U.S. PATENT DOCUMENTS 4,387,350 6/1983 Bessolo et al. ................ 331/116 FE
4,442,415 4/1984 Ashiola .......................... 331/161 X Primary Examiner—Siegfried H. Grimm
Attorney, Agent, or Firm—James W. Rose; Daniel H. Kane

[57] ABSTRACT

A CMOS oscillator integrated circuit in a Pierce crystal oscillator circuit configuration operates at oscillating frequencies over a wide band frequency range. A single inverter stage (I1) is coupled between the oscillator input (OSC IN) and the oscillator output (OSC OUT). An oscillator feedback circuit coupled between the oscillator output and oscillator input incorporates an oscillator crystal (XTAL). A pullup gain network (PNET) provides a plurality of different parallel pullup gain paths between the pullup transistor (P1) of the inverter stage (I1) and the high potential power rail ($V_{CC}$). The pullup gain paths have different pullup gain resistances (RP2, RP3, ... RPN) in the respective pullup gain paths for implementing different amplifying gains ($A_N$) by the inverter stage (I1). Digitally addressable pullup gain switches (P2, P3, ... PN) are coupled in respective pullup gain paths for selecting different gain paths and different amplifying gains ($A_N$). A similar pulldown gain network (NNET) is coupled between the pulldown transistor (N1) of the inverter stage (I1) and the low potential power rail (GND). The CMOS oscillator circuit therefore accommodates different oscillator crystals having different operative gain limits ($A_{MIN}$, $A_{MAX}$) and different characteristic operating frequencies for operating the CMOS oscillator circuit over a wide band of digitally selectable operating frequencies.

19 Claims, 4 Drawing Sheets

WIDE BAND SELECTABLE GAIN AND OPERATING FREQUENCY CMOS OSCILLATOR CIRCUIT

TECHNICAL FIELD

This invention relates to a new CMOS crystal oscillator integrated circuit using a Pierce oscillator type circuit configuration. The invention provides a selectable gain and selectable operating frequency CMOS crystal oscillator IC for operation over a wide band frequency range. Pullup and pulldown gain networks provide digitally addressable alternative gain paths for accommodating different oscillator crystals having different characteristic operative gain limits and operating frequencies over a wide band frequency range of 1-130 MHz.

BACKGROUND ART

A standard IC CMOS crystal oscillator in a Pierce oscillator circuit configuration is illustrated in FIG. 1. A single inverter stage I1 is coupled between an oscillator input OSC IN and an oscillator output OSC OUT and provides amplified inverted output signals of low and high potential levels in response to feedback input signals of high and low potential levels. The inverter stage I1 includes a PMOS pullup transistor P1 having a primary current path through source and drain nodes coupled between a high potential power rail $V_{CC}$ and the oscillator output OSC OUT for sourcing current to the oscillator output. An NMOS pulldown transistor N1 has a primary current path through drain and source nodes coupled between the oscillator output OSC OUT and a low potential power rail GND for sinking current from the oscillator output. The inverter stage I1 amplifies the signals with a specified gain $A_N$.

An oscillator feedback circuit is coupled between the oscillator output OSC OUT and the oscillator input OSC IN for causing oscillation by the CMOS oscillator circuit. The oscillator feedback circuit incorporates an oscillator crystal XTAL having a selected operating frequency within a narrow frequency band at an amplifying gain $A_N$ between operative minimum gain $A_{MIN}$ and maximum gain $A_{MAX}$ limits characteristic of the oscillator crystal XTAL. The oscillator circuit generally incorporates bias resistors R1,R2 and bias capacitors C1,C2 in the feedback circuit biasing network.

For oscillation to occur in the Pierce oscillator, two criteria must be met. First the gain $A_N$ of the active inverter stage I1 must be great enough to drive the crystal XTAL and biasing network to cause oscillation. Generally the gain around the oscillator feedback loop and active inverter stage must be greater than 1. To achieve this the gain $A_N$ of the inverter stage I1 must be sufficient to compensate for the gain loss through the impedance of the crystal XTAL and biasing network and generally at a minimum gain $A_{MIN}$ characteristic of the crystal XTAL for sustaining oscillation. If the gain is too great, i.e. greater than a maximum gain $A_{MAX}$ also characteristic of the crystal, then the crystal oscillator may not start. Thus, the Pierce crystal oscillator will only operate within a selected gain range or selected gain limits $A_{MIN}$, $A_{MAX}$.

The second criterion is that the total phase shift around the oscillator feedback loop must be 360°. The total phase shift is ideally achieved through the 180° phase shift across active inverter stage I1 and the 180° phase shift across the crystal XTAL. The phase shift across the crystal XTAL and biasing network tends to compensate for the additional phase shift caused by the propagation delay through inverter I1.

A disadvantage of the conventional Pierce crystal oscillator integrated circuit configuration is the limited frequency band of operation of the oscillator. The crystal oscillator is limited to the narrow band operating frequency of a particular crystal or a limited number of crystals with operative gain ranges $A_{MIN}$, $A_{MAX}$ encompassing the fixed gain $A_N$ of the particular inverter stage I1.

OBJECTS OF THE INVENTION

It is therefore an object of the present invention to provide a new CMOS crystal oscillator integrated circuit capable of sustaining operation over a wide band of oscillating frequencies, for example 1-130 MHz.

Another object of the invention is to provide a single dedicated CMOS integrated circuit crystal oscillator capable of accommodating different oscillating crystals having different operative gain ranges and different operating frequencies over the wide band frequency range.

A further object of the invention is to provide a CMOS Pierce crystal oscillator having different selectable gain paths digitally addressable for selecting different operative gain ranges for accommodating the different oscillator crystals.

DISCLOSURE OF THE INVENTION

In order to accomplish these results, the invention provides a pullup gain network having a plurality of different parallel pullup gain paths coupled in series with the primary current path of the pullup transistor in the active inverter stage. The pullup gain network is coupled between the pullup transistor and high potential power rail. The pullup gain paths have selected pullup gain resistances in the respective pullup gain paths for selecting and implementing different amplifying gains by the inverter stage of the CMOS oscillating circuit.

According to the invention digitally addressable pullup gain switch elements are coupled in the respective pullup gain paths for selecting the different gain paths and different amplifying gains for the inverter stage. A feature of this arrangement is that different amplifying gains may be selected within different operative gain limits of different oscillating crystals with characteristic oscillating frequencies over a wide band frequency range.

A pulldown gain network having a plurality of different parallel pulldown gain paths is coupled in series with the primary current path of the pulldown transistor in the active inverter stage of the oscillator circuit. The pulldown gain network is coupled between the pulldown transistor and low potential power rail. The pulldown gain paths also have selected pulldown gain resistances in the respective pulldown gain paths for selecting and implementing different amplifying gains by the inverter stage of the CMOS oscillator circuit.

The invention also provides digitally addressable pulldown gain switch elements in the respective pulldown gain paths for selecting the different gain paths and different amplifying gains for the inverter stage. The respective amplifying gains may also be selected within different operative gain limits of the different oscillating crystals for a wide band frequency range.

In the preferred example embodiment, pullup gain resistors are coupled in the respective pullup gain paths of the pullup gain network, and pulldown gain resistors are coupled in the respective pulldown gain paths of the pulldown gain network. The pullup gain switch elements comprise PMOS pullup gain switch transistors in the respective pullup gain paths in series with the pullup gain resistors. Similarly the pulldown gain switch elements comprise pulldown gain switch transistors coupled in the respective pulldown gain paths in series with the pulldown gain resistors. The pullup and pulldown gain switch transistors have respective control gate inputs coupled together for digital addressing and selection of the different gain paths.

According to a further example embodiment the pullup and pulldown gain resistances are provided by the channel dimensions and channel resistances of the respective pullup and pulldown gain switch transistors.

Other objects, features and advantages of the invention are apparent in the following specification.

DESCRIPTION OF PREFERRED EXAMPLE EMBODIMENTS AND BEST MODE OF THE INVENTION

Figure 1:
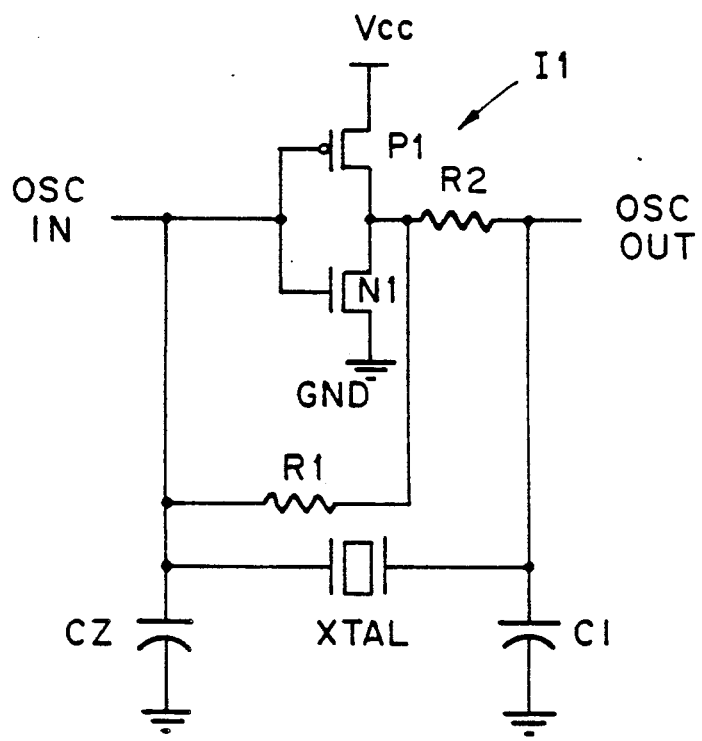
FIG. 1 is a schematic circuit diagram of a prior art CMOS IC crystal oscillator in a Pierce oscillator circuit configuration.
Figure 2:
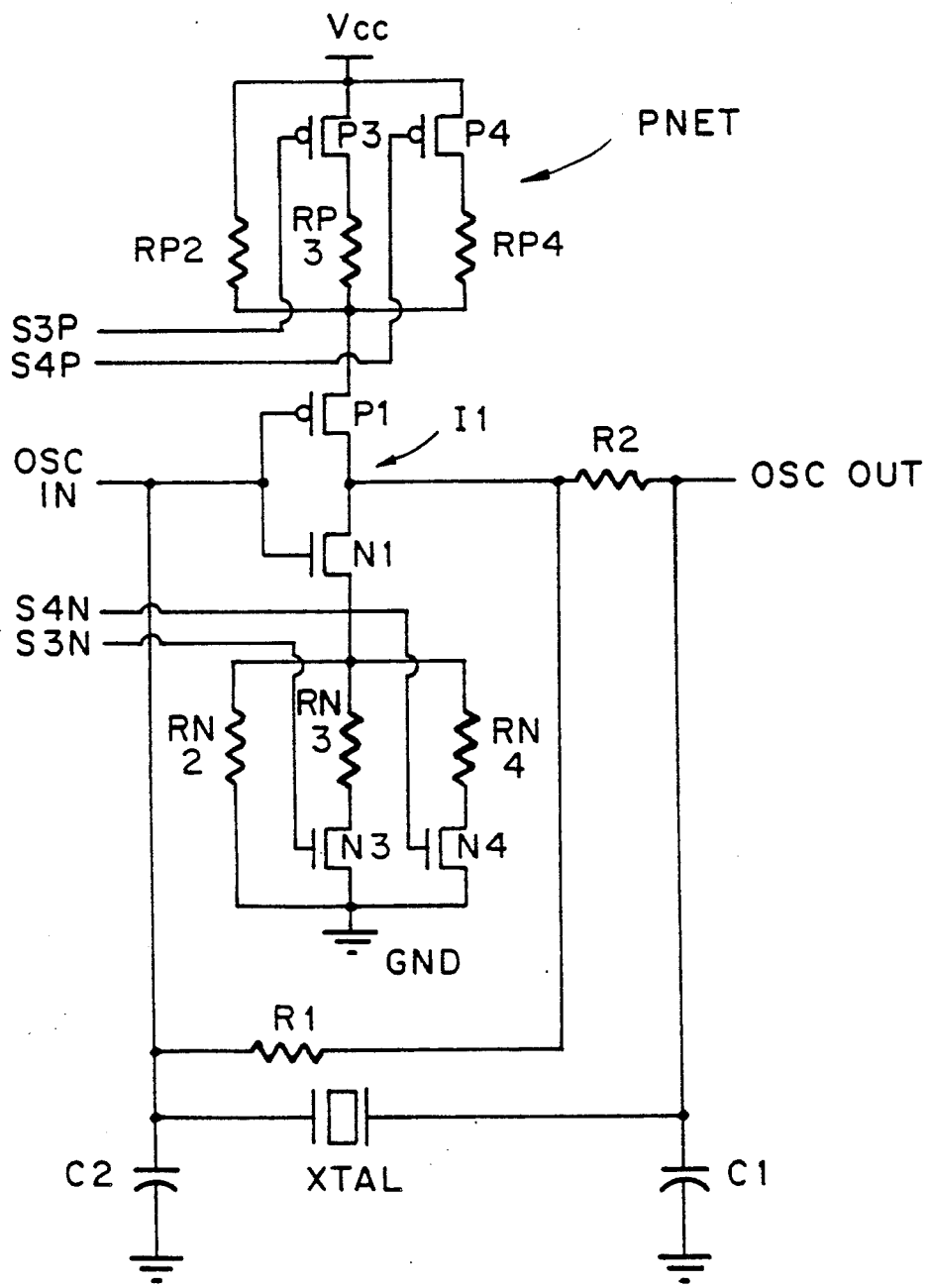
FIG. 2 is a schematic circuit diagram of a CMOS crystal oscillator circuit according to the invention with selectable gain paths and selectable gain ranges for accommodating different oscillating crystals with different characteristic oscillating frequencies.

In the wide band selectable gain and oscillating frequency CMOS oscillator circuit of FIG. 2, a pullup gain network PNET is coupled between pullup transistor P1 of inverter stage I1 and the high potential power rail $V_{CC}$. The pullup gain network PNET provides, in this example, three alternative parallel gain paths in series with the primary current path through the source and drain nodes of pullup transistor P1. Pullup gain resistors RP2, RP3, and RP4 are coupled in the respective parallel gain paths.

In the example of FIG. 2, a first pullup gain resistor RP2 is coupled in the first gain path which is always conducting when P1 is conducting. In the second gain path, second pullup gain resistor RP3 is coupled in series with a PMOS switch transistor P3 having a gain control input S3P coupled to the control gate node for switching on and off (closing and opening) the second gain path. In the third gain path a third pullup gain resistor RP4 is coupled in series with PMOS switch transistor P4 having a gain control input S4P coupled to the control gate node for switching on and off the third gain path.

Similarly, a pulldown gain network NNET is coupled between pulldown transistor N1 of inverter stage I1 and the low potential power rail GND. The pulldown gain network NNET provides in this example, three corresponding alternative parallel gain paths in series with the primary current path through the drain and source nodes of pulldown transistor N1. Pulldown gain resistors RN2, RN3, and RN4 are coupled in the respective parallel gain paths.

The first pulldown gain resistor RN2 is similarly coupled in the first gain path which is always conducting when N1 is conducting. In the second gain path, second pulldown gain resistor RN3 is coupled in series with NMOS switch transistor N3 having a gain control input S3N coupled to the control gate node for switching on and off (closing and opening) the second gain path. In the third gain path, the third pulldown gain resistor RN4 is coupled in series with NMOS switch transistor N4 having a control input S4N coupled to the control gate node for switching on and off the third gain path.

The values of pullup gain resistors RP2, RP3, RP4, and the values of pulldown gain resistors RN2, RN3, RN4 are selected for operation of the inverter stage I1 over a sufficient range of gains $A_N$ to accommodate different crystals with operating oscillating frequencies over a wide band range of, for example, 1-130 MHz. For digital addressing of the switch transistors P3, P4, N3, N4 in binary code, the resistance values of the gain resistors may be selected for different parallel combinations of resistance values to achieve the different required amplification gains $A_N$ by inverter stage I1 to accommodate the desired range of oscillator crystals XTAL.

Figure 3:
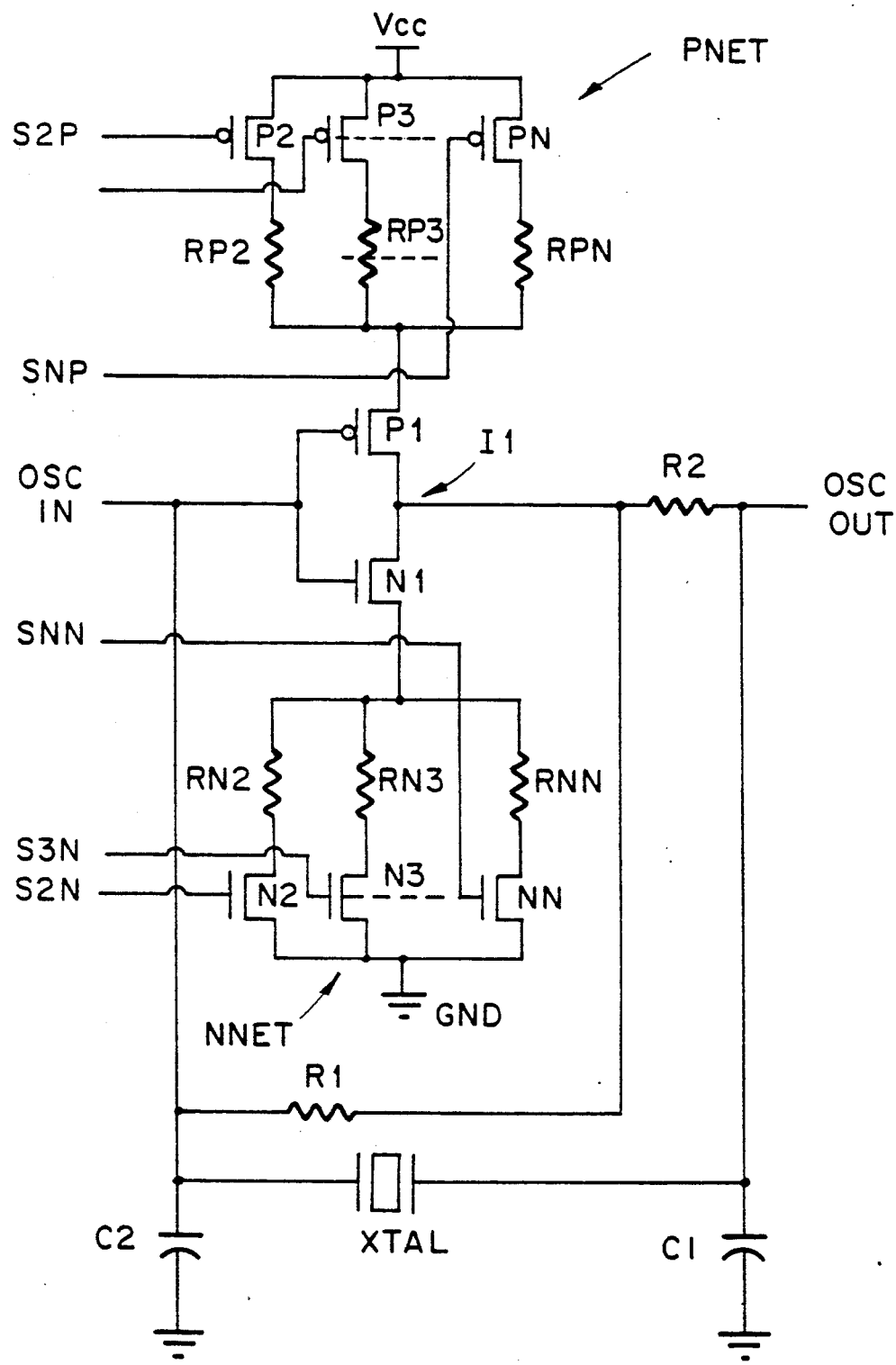
FIG. 3 is a schematic circuit diagram of the preferred generalized wide band CMOS crystal oscillator circuit in which the pullup and pulldown gain paths comprise respective gain resistors and gain switch transistors coupled in series.

In the preferred example of FIG. 3, any desired number N of gain paths is provided in the pullup gain network PNET and pulldown gain network NNET to achieve the required gain limits for a wide band range of crystal oscillator operating frequencies. A gain switch transistor is also provided in each gain path. Thus, a first PMOS pullup gain transistor P2 with gain control input S2P coupled to the control gate node is added to the first gain path in the pullup gain network PNET in series with the first pullup gain resistor RP2. Similarly, a first NMOS pulldown gain transistor N2 with gain control input S2N coupled to the control gate node is added to the first gain path in the pulldown gain network NNET in series with the first pulldown gain resistor RN2. In the Nth gain paths, pullup gain resistor RPN and switch transistor PN are coupled in series in the pullup gain network PNET, and pulldown gain resistor RNN and switch transistor NN are coupled in series in the pulldown gain network NNET.

The resistance values for pullup and pulldown gain resistors RP2, RP3, . . . , RPN, RN2, RN3, . . . , RNN are selected to provide the necessary combination of parallel resistances under digital addressing at the gain control inputs S2P, S3P, . . . , SNP, S2N, S3N, . . . , SNN for different amplifying gains $A_N$ to accommodate the different crystals XTAL for operating frequencies over a wide band frequency range.

Tables I and II set forth example parameter values for components of the pullup and pulldown gain networks in the wide band oscillator circuit of FIG. 2. In the example of FIG. 2, three gain path combinations through the gain networks PNET, NNET are used for achieving an oscillator bandwidth of 1-130 MHz. The first gain path combination is limited to the first gain path through gain path resistors RP2, RN2 and is selected with gain switch transistors P3, P4, N3, N4 off. The second gain path combination is the first gain path with the second gain path through P3, RP3, RN3, N3 added in parallel by turning on gain switch transistors P3, N3. The third gain path combination is the first and second gate paths in parallel with the third gain path through P4, RP4, RN4, N4 added in parallel by also turning on gain switch transistors P4, N4. The resistance values for the respective gain resistors are set forth in TABLE I while channel width dimensions for the gain switch transistors and inverter stage transistors are set forth in TABLE II. The oscillation frequency ranges for the three combinations of gain paths are set forth in TABLE III. Example binary codes for digital addressing at the gain control inputs for the three gain paths, to implement different amplifying gains $A_N$ for inverter stage I1, are set forth in TABLE IV. The different amplifying gains $A_N$ fall within the respective gain limits $A_{MIN}$, $A_{MAX}$ of the different crystals for oscillation frequencies in the specified bands over the wide band frequency range.

TABLE I

| Gain Resistor | Resistance Value |
|---|---|
| R2P | 1000Ω |
| R3P | 170Ω |
| R4P | 30Ω |
| R2N | 1000Ω |
| R3N | 170Ω |
| R4N | 30Ω |

TABLE II

| Gain Switch Transistor | Channel Width (μ) |
|---|---|
| P1 | 1320μ |
| P3 | 880μ |
| P4 | 1320μ |
| N1 | 600μ |
| N3 | 400μ |
| N4 | 600μ |

TABLE III

| Parallel Gain Path Combinations | Operating Frequency Range |
|---|---|
| 1 | 1–20 MHz |
| 1 + 2 | 20–50 MHz |
| 1 + 2 + 3 | 50–130 MHz |

TABLE IV

| Frequency Bands | Gain Control Inputs (FIG. 2) | | | |
|---|---|---|---|---|
| | S3P | S4P | S3N | S4N |
| 1–20 MHz | 1 | 1 | 0 | 0 |
| 20–50 MHz | 0 | 1 | 1 | 0 |
| 50–130 MHz | 0 | 0 | 1 | 1 |

Figure 4:
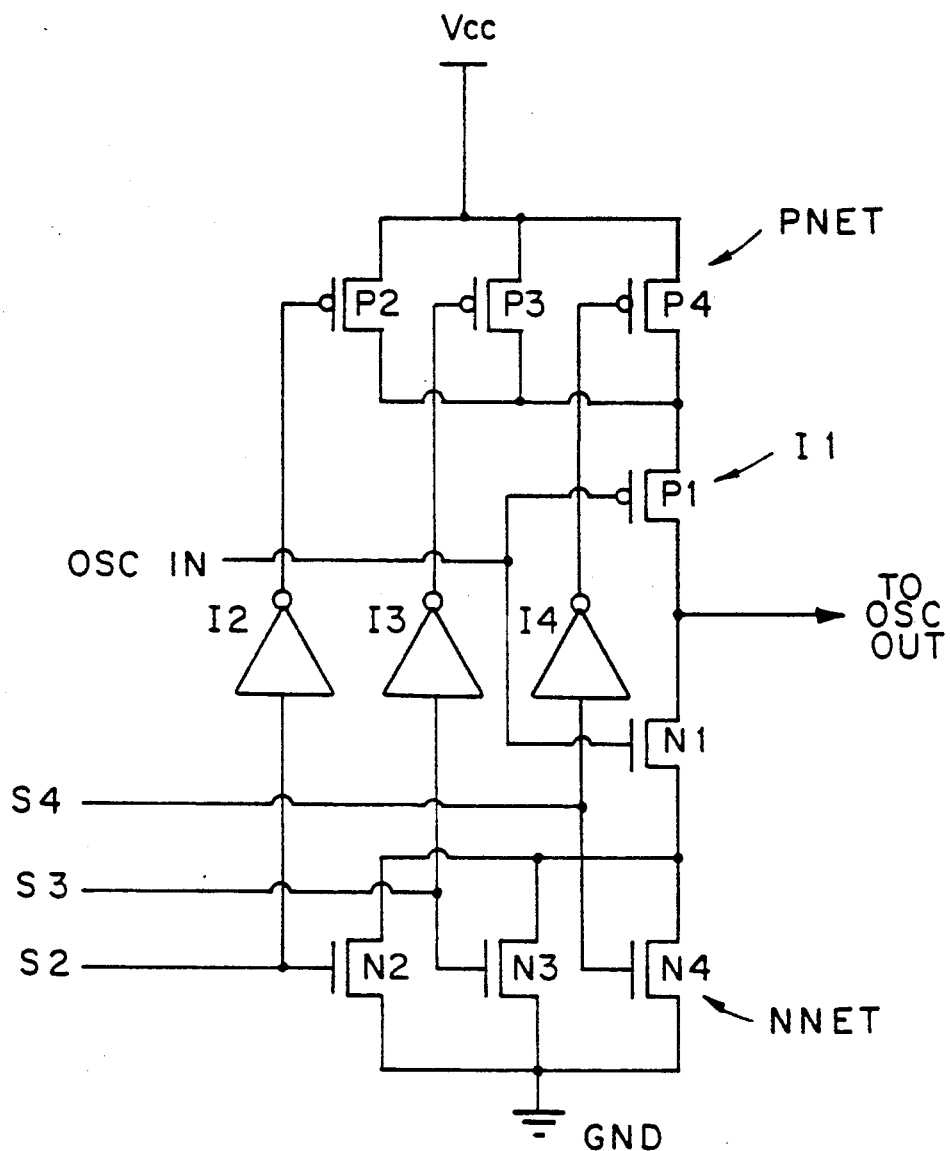
FIG. 4 is a fragmentary schematic circuit diagram of the input and output section of an alternative wide band CMOS crystal oscillator circuit in which the pullup and pulldown gain resistances are provided by the channel widths and channel resistances of the respective pullup and pulldown gain switch transistors.

A fragmentary circuit diagram of the input section OSC IN, inverter stage I1, and pullup and pulldown gain networks PNET, NNET of an alternative circuit configuration for the CMOS oscillator circuit is illustrated in FIG. 4. In this example, there are no separate gain resistors in the respective pullup and pulldown gain paths of the gain networks PNET, NNET. The respective gain resistances are instead provided by the selected channel width dimensions and channel resistances of the respective pullup gain switch transistors P2, P3, P4 and pulldown gain switch transistors N2, N3, N4. A single set of gain control inputs S2, S3, S4 is coupled directly to the control gate nodes of pulldown gain switch transistors N2, N3, N4, and through inverter stages I2, I3, I4 to the control gate nodes of pullup gain switch transistors P2, P3, P4.

While the invention has been described with reference to particular example embodiments, it is intended to cover all variations and equivalents within the scope of the following claims.

I claim:

1. A CMOS oscillator circuit having an inverter stage (I1) coupled between an oscillator input (OSC IN) and an oscillator output (OSC OUT), said inverter stage comprising a pullup transistor (P1) and a pulldown transistor (N1) having primary current paths through source and drain nodes coupled between the oscillator output (OSC OUT) and respective high and low potential power rails ($V_{CC}$, GND), an oscillator feedback circuit coupled between the oscillator output (OSC OUT) and oscillator input (OSC IN) comprising an oscillator crystal (XTAL), the improvement for accommodating different oscillator crystals having different characteristic operating frequencies and operating between different operative gain limits ($A_{MIN}$, $A_{MAX}$) for operating the CMOS oscillator circuit over a wide band of selected operating frequencies comprising:

a pullup gain network (PNET) having a plurality of different parallel pullup gain paths coupled in series with the primary current path of the pullup transistor (P1) between the pullup transistor (P1) and high potential power rail ($V_{CC}$), said pullup gain paths having selected pullup gain resistance means in the respective pullup gain paths for implementing different amplifying gains ($A_N$) by the inverter stage (I1) for the CMOS oscillator circuit;

and digitally addressable pullup gain switch means (P2, P3 ... PN) coupled in respective pullup gain paths for selecting different gain paths and different amplifying gains ($A_N$) for the inverter stage (I1) within different operative gain limits ($A_{MIN}$, $A_{MAX}$) of different oscillating crystals.

2. The CMOS oscillator circuit of claim 1 comprising:

a pulldown gain network (NNET) having a plurality of different parallel pulldown gain paths coupled in series with the primary current path of the pulldown transistor (N1) between the pulldown transistor (N1) and low potential power rail (GND), said pulldown gain paths also having selected pulldown gain resistance means in the respective pulldown gain paths for implementing different amplifying gains ($A_N$) by the inverter stage (I1) for the CMOS oscillator circuit;

and digitally addressable pulldown gain switch means (N2, N3 ... NN) coupled in respective pulldown gain paths for selecting different gain paths.

3. The CMOS oscillator circuit of claim 1 wherein the pullup gain resistance means comprise respective pullup gain resistors (RP2, RP3 ... RPN) coupled in the respective pullup gain paths of the pullup gain network (PNET).

4. The CMOS oscillator circuit of claim 2 wherein the pulldown gain resistance means comprise respective pulldown gain resisters (RN2, RN3 ... RNN) coupled in the respective pulldown gain paths of the pulldown gain network (NNET).

5. The CMOS oscillator circuit of claim 3 wherein the pullup gain switch means comprise pullup gain switch transistors (P2, P3 ... PN) coupled in the respective pullup gain paths of the pullup gain network (PNET), , and further comprising gain switch control inputs (S2, S3, . . . SN; S2P, S3P, . . . SNP) for digital addressing and selection of different gain paths.

6. The CMOS oscillator circuit of claim 4 wherein the pulldown gain switch means comprise pulldown gain switch transistors (N2, N3, . . . NN) coupled in respective pulldown gain paths of the pulldown gain network (NNET) and further comprising gain switch control inputs (S2N, S3N, . . . SNN; S2, S3, . . . SN).

7. The CMOS oscillator circuit of claim 5 wherein the pullup gain resistance means further comprise selected gate channel dimensions and channel resistances of said respective pullup gain switch transistors (P2, P3, . . . PN).

8. The CMOS oscillator circuit of claim 6 wherein the pulldown gain resistance means further comprise selected channel dimensions and channel resistances of said respective pulldown gain switch transistors (N2, N3, . . . NN).

9. The CMOS oscillator circuit of claim 1 wherein the pullup gain resistance means comprise the respective pullup gain switch transistors (P2, P3, . . . PN) having primary current paths through source and drain nodes coupled in respective pullup gain paths, said pullup gain switch transistors having selected gate channel dimensions and channel resistances interposed in the respective pullup gain paths for implementing different amplifying gains ($A_N$) by the inverter stage (I1).

10. The CMOS oscillator circuit of claim 2 wherein the pulldown gain resistance means comprise the respective pulldown gain switch transistors (P2, P3, . . . PN) having primary current paths through source and drain nodes coupled in respective pulldown gain paths, said pulldown gain switch transistors having selected gate channel dimensions and channel resistances interposed in the respective pulldown gain paths for implementing different amplifying gains ($A_N$) by the inverter stage (I1).

11. A CMOS oscillator circuit having an inverter stage (I1) coupled between an oscillator input (OSC IN) and an oscillator output (OSC OUT) for delivering amplified inverted output signals of low and high potential levels in response to feedback input signals, said inverter stage comprising a pullup transistor (P1) having a primary current path through source and drain nodes coupled between the oscillator output (OSC OUT) and a high potential power rail ($V_{CC}$) for sourcing current to the oscillator output (OSC OUT), a pulldown transistor (N1) having a primary current path through source and drain nodes coupled between the oscillator output (OSC OUT) and a low potential power rail (GND) for sinking current from the oscillator output (OSC OUT), said inverter stage (I1) amplifying the signals with a specified gain ($A_N$), an oscillator feedback circuit coupled between the oscillator output (OSC OUT) and oscillator input (OSC IN) for causing oscillation by the CMOS oscillator circuit, said oscillator feedback circuit comprising an oscillator crystal (XTAL) having a selected oscillating operating frequency within a narrow frequency band, the improvement for accommodating different oscillator crystals having different operative gain limits ($A_{MIN}$, $A_{MAX}$) and different characteristic operating frequencies for operating the CMOS oscillator circuit over a wide band of selected operating frequencies comprising:

a pullup gain network (PNET) having a plurality of different parallel pullup gain paths coupled in series with the primary current path of the pullup transistor (P1) between the pullup transistor (P1) and high potential power rail ($V_{CC}$), said pullup gain paths having selected pullup gain resistances in the respective pullup gain paths for implementing different amplifying gains ($A_N$) by the inverter stage (I1) for the CMOS oscillating circuit;

a pulldown gain network (NNET) having a plurality of different parallel pulldown gain paths coupled in series with the primary current path of the pulldown transistor (N1) between the pulldown transistor (N1) and low potential power rail (GND), said pulldown gain paths also having selected pulldown gain resistances in the respective pulldown gain paths for implementing different amplifying gains ($A_N$) by the inverter stage (I1) for the CMOS oscillating circuit;

and digitally addressable pullup gain switches (P2,P3 . . . PN) coupled in respective pullup gain paths, and pulldown gain switches (N2, N3 . . . NN) coupled in respective pulldown gain paths, for selecting different gain paths and different amplifying gains ($A_N$) for the inverter stage (I1) within different operative gain limits ($A_{MIN}$, $A_{MAX}$) of different oscillating crystals.

12. The CMOS oscillator circuit of claim 11 wherein the pullup gain resistances comprise respective pullup gain resistors (RP2, RP3 . . . RPN) coupled in the respective pullup gain paths of the pullup gain network (PNET) and wherein the pulldown gain resistances comprise respective pulldown gain resisters (RN2,RN3 . . . RNN) coupled in the respective pulldown gain paths of the pulldown gain network (NNET).

13. The CMOS oscillator circuit of claim 12 wherein the pullup gain switches comprise respective pullup gain switch transistors (P2,P3 . . . PN) coupled in the respective pullup gain paths of the pullup gain network (PNET), wherein the pulldown gain switches comprise respective pulldown gain switch transistors (N2, N3, . . . NN) coupled in respective pulldown gain paths of the pulldown gain network (NNET), and further comprising gain switch control inputs (S2, S3, . . . SN; S2P, S3P, . . . SNP; S2N, S3N, . . . SNN) for digital addressing and selection of different gain paths.

14. The CMOS oscillator circuit of claim 13 wherein the pullup gain resistances further comprise selected gate channel dimensions and channel resistances of said respective pullup gain switch transistors (P2, P3, . . . PN) and wherein the pulldown gain resistances further comprise selected channel dimensions and channel resistances of said respective pulldown switch transistors (N2, N3, . . . NN).

15. The CMOS oscillator circuit of claim 11 wherein the pullup gain resistances comprise the respective pullup gain switch transistors (P2, P3, . . . PN) having primary current paths through source and drain nodes coupled in respective pullup gain paths, said pullup gain switch transistors having selected gate channel dimensions and channel resistances interposed in the respective pullup gain paths for implementing different amplifying gains ($A_N$) by the inverter stage (I1).

16. The CMOS oscillator circuit of claim 15 wherein the pulldown gain resistances comprise the respective pulldown gain switch transistors (P2, P3, . . . PN) having primary current paths through source and drain nodes coupled in respective pulldown gain paths, said pulldown gain switch transistors having selected gate channel dimensions and channel resistances interposed in the respective pulldown gain paths for implementing different amplifying gains ($A_N$) by the inverter stage (I1).

17. A CMOS oscillator circuit having an inverter stage (I1) coupled between an oscillator input (OSC IN) and an oscillator output (OSC OUT) for delivering amplified inverted output signals of low and high potential levels in response to feedback input signals, said inverter stage comprising a pullup transistor (P1) having a primary current path through source and drain nodes coupled between the oscillator output (OSC OUT) and a high potential power rail ($V_{CC}$) for sourcing current to the oscillator output (OSC OUT), a pulldown transistor (N1) having a primary current path through source and drain nodes coupled between the oscillator output (OSC OUT) and a low potential power rail (GND) for sinking current from the oscillator output (OSC OUT), said inverter stage (I1) amplifying the signals with a specified gain ($A_N$), an oscillator feedback circuit coupled between the oscillator output (OSC OUT) and oscillator input (OSC IN) for causing oscillation by the CMOS oscillator circuit, said oscillator feedback circuit comprising an oscillator crystal (XTAL) having a selected oscillating operating frequency within a narrow frequency band at said amplifying gain ($A_N$) between operative minimum gain ($A_{MIN}$) and maximum gain ($A_{MAX}$) limits characteristic of the oscillator crystal (XTAL), the improvement for accommodating different oscillator crystals having different operative gain limits and different characteristic operating frequencies for operating the CMOS oscillator circuit over a wide band of selected operating frequencies comprising:

a pullup gain network (PNET) having a plurality of different parallel pullup gain paths coupled in series with the primary current path of the pullup transistor (P1) between the pullup transistor (P1) and high potential power rail ($V_{CC}$) for implementing different amplifying gains ($A_N$) by the inverter stage (I1) for the CMOS oscillating circuit;

a pulldown gain network (NNET) having a plurality of different parallel pulldown gain paths coupled in series with the primary current path of the pulldown transistor (N1) between the pulldown transistor (N1) and low potential power rail (GND) for implementing different amplifying gains ($A_N$) by the inverter stage (I1) for the CMOS oscillating circuit;

and digitally addressable pullup gain switch transistors (P2,P3 . . . PN) coupled in respective pullup gain paths, and pulldown gain switch transistors (N2, N3 . . . NN) coupled in respective pulldown gain paths, for selecting different gain paths and different amplifying gains ($A_N$) for the inverter stage (I1) within different operative gain limits ($A_{MIN}$, $A_{MAX}$) of different oscillating crystals;

said pullup and pulldown gain switch transistors having gain switch control inputs (S2, S3, . . . SN; S2P, S3P, . . . SNP; S2N, S3N, . . . SNN) for digital addressing and selection of different gain paths;

said pullup gain switch transistors (P2, P3, . . . PN) and pulldown gain switch transistors (N2, N3, . . . NN) being constructed with selected gate channel dimensions and channel resistances interposed in the respective pullup and pulldown gain paths for defining the different amplifying gains ($A_N$) within different gain limits ($A_{MIN}$, $A_{MAX}$) of different oscillator crystals (XTAL) by the inverter stage (I1).

18. A CMOS oscillator circuit having an inverter stage (I1) coupled between an oscillator input (OSC IN) and an oscillator output (OSC OUT), said inverter stage comprising a pullup transistor (P1) and a pulldown transistor (N1) having primary current paths through source and drain nodes coupled between the oscillator output (OSC OUT) and respective high and low potential power rails ($V_{CC}$, GND), an oscillator feedback circuit coupled between the oscillator output (OSC OUT) and oscillator input (OSC IN) comprising an oscillator crystal (XTAL), the improvement for accommodating different oscillator crystals having different characteristic operating frequencies and operating between different operative gain limits ($A_{MIN}$, $A_{MAX}$) for operating the CMOS oscillator circuit over a wide band of selected operating frequencies comprising:

a pullup gain network (PNET) having a plurality of different parallel pullup gain paths coupled in series with the primary current path of the pullup transistor (P1) between the pullup transistor (P1) and high potential power rail ($V_{CC}$) for implementing different amplifying gains ($A_N$) by the inverter stage (I1) for the CMOS oscillator circuit;

and digitally addressable pullup gain switch transistors (P2,P3 . . . PN) coupled in respective pullup gain paths for selecting different gain paths and different amplifying gains ($A_N$) for the inverter stage (I1) within different operative gain limits ($A_{MIN}$, $A_{MAX}$) of different oscillating crystals;

said pullup gain switch transistors having selected gate channel dimensions and channel resistances interposed in the respective pullup gain paths for implementing different amplifying gains ($A_N$) by the inverter stage (I1).

19. The CMOS oscillator circuit of claim 18 comprising:

a pulldown gain network (NNET) having a plurality of different parallel pulldown gain paths coupled in series with the primary current path of the pulldown transistor (N1) between the pulldown transistor (N1) and low potential power rail (GND) for implementing different amplifying gains ($A_N$) by the inverter stage (I1) for the CMOS oscillator circuit;

and digitally addressable pulldown gain switch transistors (N2, N3 . . . NN) coupled in respective pulldown gain paths for selecting different gain paths;

said pulldown gain switch transistors having selected gate channel dimensions and channel resistances interposed in the respective pulldown gain paths for implementing different amplifying gains ($A_N$) by the inverter stage (I1).

* * * * *